US006617184B2

(12) United States Patent
Böhler et al.

(10) Patent No.: US 6,617,184 B2
(45) Date of Patent: Sep. 9, 2003

(54) PROCESS OF MINIMIZING THE OPERATING VOLTAGE OF AN ORGANIC LIGHT EMITTING DIODE

(75) Inventors: Achim Böhler, Braunschweig (DE); Stefan Wiese, Braunschweig (DE); Dirk Metzdorf, Braunschweig (DE); Wolfgang Kowalsky, Braunschweig (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/873,092

(22) Filed: Jun. 1, 2001

(65) Prior Publication Data

US 2001/0025956 A1 Oct. 4, 2001

Related U.S. Application Data

(62) Division of application No. 09/335,565, filed on Jun. 18, 1999, now Pat. No. 6,262,441.

(30) Foreign Application Priority Data

Jun. 18, 1998 (DE) .......................... 198 27 222

(51) Int. Cl.$^7$ .......................... H01L 21/00; H01L 51/40
(52) U.S. Cl. .......................... 438/22; 438/99; 438/597
(58) Field of Search .......................... 438/22, 99, 582, 438/590, 589, 602, 24, 623, 622, 652, 648, 650, 683, 685, 688

(56) References Cited

U.S. PATENT DOCUMENTS

| 4,356,429 | A | | 10/1982 | Tang |
| 5,247,190 | A | | 9/1993 | Friend et al. |
| 5,707,745 | A | * | 1/1998 | Forrest et al. .............. 428/432 |
| 5,747,183 | A | | 5/1998 | Shi et al. |
| 5,776,622 | A | * | 7/1998 | Hung et al. ................. 428/690 |
| 5,952,779 | A | | 9/1999 | Arai et al. |
| 6,002,206 | A | * | 12/1999 | Harrison et al. ............ 313/506 |
| 6,133,581 | A | * | 10/2000 | Terao et al. ................... 257/40 |
| 6,172,459 | B1 | * | 1/2001 | Hung et al. .................... 506/1 |
| 6,284,393 | B1 | * | 9/2001 | Hosokawa et al. ......... 428/690 |
| 2002/0021088 | A1 | * | 2/2002 | Howard et al. ............. 313/504 |

* cited by examiner

*Primary Examiner*—Savitri Mulpuri
(74) *Attorney, Agent, or Firm*—Laurence A. Greenberg; Werner H. Stemer; Gregory L. Mayback

(57) ABSTRACT

The process of minimizing the operating voltage of an organic light emitting diode includes the steps of providing a transparent substrate and applying a transparent bottom electrode thereto. It furthermore includes the step of applying to the bottom electrode a semitransparent layer of a metal having a work function in the range from 4 to 7 eV and applying to the semitransparent layer at least one organic functional layer and a top electrode including magnesium and silver.

12 Claims, No Drawings

PROCESS OF MINIMIZING THE OPERATING VOLTAGE OF AN ORGANIC LIGHT EMITTING DIODE

CROSS-REFERENCE TO RELATED APPLICATION

This application is a division of U.S. application Ser. No. 09/335,565, filed Jun. 18, 1999 U.S. Pat. No. 6,262,441.

BACKGROUND OF THE INVENTION

Field of the Invention

The invention relates to a process of minimizing the operating voltage of an organic light emitting diode, i.e. a light emitting diode including an organic polymer and/or certain low molecular weight organic compounds.

As more and more data and information are being exchanged, the visualization of these, preferably in communication technology terminals, is becoming increasingly important. This presentation of information usually takes place through the use of pixel matrix display devices which, where appropriate, include additional predefined icons. Known technologies of pixel matrix devices include, for example, cathode ray tubes, although these, given the space they require, the electric power they absorb and their weight, are ruled out for use in mobile and portable electronic equipment. Significantly more suitable for this purpose are flat panel displays, which these days are predominantly based on liquid crystal display (LC display) technology.

Simple, monochrome, passive matrix driven LC displays have the advantage of being able to be fabricated cost effectively while absorbing little electric power, being lightweight and requiring little space. Using such displays also entails serious drawbacks, however. To be specific, the displays, given their technological/physical principle, are not self emitting, i.e. they can be read and discerned reliably only under particularly favorable ambient light conditions. A further significant limitation lies in the seriously restricted viewing angle of the display.

The problem of lacking contrast under non-optimal ambient light conditions can be ameliorated by an additionally fitted back lighting. However, that amelioration entails a number of drawbacks. The back lighting, for example, causes the thickness of the LC flat panel display to be many times greater. That is to say, while LC displays without backlighting can be fabricated with a thickness of <1 mm, the total thickness of backlit LC displays is typically several millimeters. Apart from the lamps or fluorescent tubes, the major contribution to the increase in thickness comes from the plastic light guide (diffusor) required for homogeneous illumination of the display area. An essential drawback of backlighting furthermore resides in the fact that most of the electric power absorbed is required for illumination. Moreover, operating the light sources (lamps and fluorescent tubes) requires a higher voltage which is usually generated from batteries or storage cells with the aid of voltage up converters.

Better performance than with LC displays driven in passive mode can be achieved with active matrix LC displays, where each pixel with its three primary colors has a thin film transistor (TFT) assigned to it. TFT technology is very complex, however, and due to the high process temperatures encountered the substrates used must meet high requirements; the price for active matrix LC displays is correspondingly high.

The switching time of an individual liquid crystal pixel is typically a few milliseconds—due to the physical principle of reorientation of a molecule in the electric field—and, moreover, is markedly temperature dependent. At low temperatures, for example, the sluggish, delayed image generation, for example in the case of transport (navigation systems in motor vehicles) is an annoying feature. In the case of applications where rapidly changing information or pictures are being displayed, for example in video applications, LC technology is therefore only conditionally suitable.

Other display technologies have either not yet reached the degree of maturity of technical applicability, for example flat panel CRTs (CRT=Cathode Ray Tube), or their use, particularly in portable electronic equipment, faces serious drawbacks due to specific characteristics: high operating voltage in the case of vacuum fluorescent displays and inorganic thin film electroluminescent displays or high costs in the case of displays based on inorganic light emitting diodes.

The abovementioned drawbacks can be circumvented through the use of displays based on organic light emitting diodes (OLEDs), i.e. electroluminescent diodes (in this context see, for example, U.S. Pat. No. 4,356,429 and U.S. Pat. No. 5,247,190). This novel technology has many and diverse advantages, compared with LC displays, of which the following are the essential ones:

Due to the principle of self emissivity, the need for backlighting is obviated, resulting in a distinct reduction in space required, power absorbed and weight.

The typical switching times of pixels are in the order of magnitude of 1 $\mu$s and thus allow rapid image sequences to be displayed without difficulty.

The switching times are not subject to annoying lag at low temperatures.

The reading angle is significantly greater than with LC displays and is almost 180°.

The polarisers required with LC displays can be dispensed with, so that greater brightness can be achieved even with a multiplexed display.

Organic light emitting diodes, in contrast to other display technologies, can be fabricated even on flexible substrates and in nonplanar geometries.

Fabrication and assembly of displays based on organic light emitting diodes is simpler, compared with LC displays, and can therefore be achieved more cost-effectively. Typically, assembly and fabrication proceed as follows.

The substrate, for example glass, is coated all over with a transparent electrode (bottom electrode, anode), for example formed of indium tin oxide (ITO). The fabrication of pixel matrix displays requires both the transparent bottom electrode and the top electrode (cathode) to be patterned. Both electrodes are customarily patterned in the form of parallel conductor tracks, the conductor tracks of bottom electrode and top electrode running perpendicular to one another. Patterning of the bottom electrode is effected through the use of a photolithographic process including wet chemical etching procedures, the details of which are known to those skilled in the art. The resolution achievable by these methods is essentially limited by the photolithographic steps and the nature of the bottom electrode. According to the prior art, this allows both pixel sizes and non emitting gaps between the pixels having a size of a few micrometers to be achieved. The length of the strip shaped conductor tracks of the bottom electrode can be as much as many centimeters. Depending on the lithographic mask used, it is even possible to fabricate emitting areas having sizes up to a few square centimeters. The sequence of the individual emitting areas can be regular (pixel matrix display) or variable (icons).

On top of the substrate bearing the patterned transparent bottom electrode, one or more organic layers are applied.

These organic layers can be formed of polymers, oligomers, low molecular weight compounds or mixtures thereof. The application of polymers, for example polyaniline, poly(p-phenylene-vinylene) and poly(2-methoxy-5-(2'-ethyl)-hexyloxy-p-phenylene-vinylene) customarily employs processes from the liquid phase (application of a solution through the use of spin coating or knife coating), whereas gas phase deposition is preferred for low molecular weight and oligomeric compounds (vapor deposition or "physical vapor deposition", (PVD). Examples of low molecular weight compounds, preferably those transporting positive charge carriers are: N,N'-bis-(3-methylphenyl)-N,N'-bis-(phenyl)-benzidine (m-TPD),4,4',4"-Tris-[N-(3-methylphenyl)-N-phenyl-amino]-triphenylamine(m-MTDATA) and 4,4',4"-Tris-(carbazol-9-yl)-triphenylamine (TCTA). The emitter used is, for example, the aluminum (III) salt of hydroxyquinoline (Alq), which may be doped with suitable chromophores (quinacridone derivatives, aromatic hydrocarbons etc.). If required, additional layers can be present which affect the electrooptical characteristics as well as the long term characteristics, for example layers of copper phthalocyanine. The total thickness of the layer sequence can be between 10 nm and 10 $\mu$m, typically being in the range between 50 and 200 nm.

The top electrode usually is formed of a metal which is generally applied by vapor phase deposition (thermal evaporation, sputtering or electron beam evaporation). Preferably, base metals and therefore in particular metals reactive with respect to water and oxygen are used, such as lithium, magnesium, aluminum and calcium, and also alloys of these metals with one another or with other metals. The patterning of the metal electrode, the patterning being required to produce a pixel matrix configuration, is generally achieved by the metal being applied through a shadow mask having appropriately shaped perforations.

A OLED display fabricated in this manner may be formed of additional devices that affect the electrooptical characteristics, examples of such devices being UV filters, polarization filters, anti-reflective coatings, devices known as "micro cavities", and color conversion and color correction filters. Also present is hermetic packaging, which protects the organic electroluminescent displays against environmental conditions such as humidity and mechanical stress. Additionally, thin film transistors to drive the individual pixels can be present.

Especially for mobile applications as in mobile phones, pagers and Personal Digital Assistants (PDAs) running on batteries, displays having as low an operating voltage as possible are desirable. This not only requires the minimum voltage necessary to generate light ($U = h \cdot c / e \cdot \lambda$, where c=speed of light, h=Planck's constant, e=electronic charge and $\lambda$=wavelength of the generated light), it also demands a substantial fraction of the voltage for overcoming intrinsic barriers which arise between the various layers.

By suitable choice of anode material and cathode material it is possible, in principle, to achieve efficient injection of the charge carriers into the component and thus to achieve a low operating voltage. Depending on the organic materials used, the aim—to achieve ohmic contacts—is for a work function of the anode in the range of from 5 to 5.5 eV. Given that, as already explained, one electrode is chosen to be transparent, in order for light to be output from the component, the anode material used typically being ITO having a work function of about 4.9 eV, attempts were made, either by post oxidation of ITO or by using other transparent oxidic substances such as vanadium oxide, to increase the work function of the anode and thus to reduce the energy barrier formed at the interface anode/organic material. While this does result in a lower operating voltage of the light emitting diodes, the anode materials used are not stable in the long term or have other drawbacks, such as higher production costs.

SUMMARY OF THE INVENTION

It is accordingly an object of the invention to provide a process of minimizing the operating voltage of an organic light emitting diode, which overcomes the hereinafore-mentioned disadvantages of the heretofore-known devices of this general type in such a way that it has as low an operating voltage as possible and can therefore be used, in particular, in the field of mobile communication, i.e. in equipment running on batteries. At the same time, the other system parameters must not be adversely affected, i.e. for example the current demand must not be too high, and long term stability must be ensured.

With the foregoing and other objects in view, there is provided, in accordance with the invention, an organic light emitting diode comprising a transparent bottom electrode located on a substrate, a top electrode, at least one organic functional layer disposed between bottom electrode and top electrode, and a semitransparent layer located on the bottom electrode and formed of a metal having a work function of between 4 and 7 eV.

The essential feature of a light emitting diode according to the invention is therefore the thin, semitransparent metal layer disposed on the transparent bottom electrode (anode), i.e. between anode and organic functional layer. The term "semitransparent" in this context means that from about 10 to 95% of the light in the visible range of the spectrum pass through the layer.

The metal layer, which preferably has a thickness of from 1 to 100 nm, serves as the injection layer for the charge carriers into the organic material, in the present case therefore as a hole injecting layer. The metal is inert and therefore stable in the long term, and the metal layer has adequate transparency. As the metal has a work function in the range of from 4 to 7 eV, the development of an energy barrier at the interface anode/organic material is prevented and the operating voltage of the light emitting diodes is thus drastically reduced.

In the organic light emitting diode of the invention, the metal layer preferably is formed of a noble metal, in particular palladium, silver, iridium, platinum or gold. Suitable metals further include, for example, chromium, iron, cobalt, nickel, molybdenum and tungsten. The most particularly preferred metal, platinum, for example, has a work function of 5.7 eV.

Materials used for the organic functional layer(s) are polymers and low molecular weight organic compounds known per se. Examples of these are polymers such as polyaniline, poly(p-phenylene-vinylene) and poly(2-methoxy-5-(2'-ethyl)-hexyloxy-p-phenylene-vinylene), and low molecular weight compounds such as aromatic nitrogen compounds including 4,4',4"-Tris-(N-3-methylphenyl-N-phenyl-amino)-triphenylamine(m-MTDATA), 4,4',4"-Tris (carbazol-9-yl)-triphenylamine (TCTA), and preferentially, N,N'-bis-(3-methylphenyl)-N,N'-bis(phenyl)-benzidine-(m-TPD) and 1,3,5-Tris-[N-(4-diphenylamino-phenyl)-phenylamino]-benzene (p-DPATDAB). In combination with an organic material, copper phthalocyanine can also be used. In order to transport the positive charge carriers, particularly advantageous use is made of 4,4',4"-Tris-[N-(1-naphthyl)-N-phenyl-amino]-triphenylamine together with the aluminum (III) salt of 8-hydroxyquinoline as the emission and electron transport material.

The bottom electrode (anode) and the top electrode (cathode) can be formed of materials which are known per se, with the bottom electrode preferably being indium tin oxide (ITO) and the top electrode preferably being formed of magnesium, aluminum, calcium, barium, samarium or ytterbium, in particular magnesium and silver, separately or being a magnesium silver alloy.

Other features which are considered as characteristic for the invention are set forth in the appended claims.

Although the invention is described herein as embodied in a process of minimizing the operating voltage of an organic light emitting diode, it is nevertheless not intended to be limited to the details provided, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying examples.

DESCRIPTION OF THE PREFERRED EMBODIMENTS

The invention will be explained in more detail with reference to working examples provided for the purpose of illustration and not limitation.

EXAMPLE 1

The entire surface of a glass substrate is coated with indium tin oxide (ITO) as a conductive, transparent electrode (anode) which is then patterned photolithographically in a manner known per se. On top of the ITO layer, a semitransparent metal injection layer of platinum (Pt) having a thickness of 5 nm is then applied through the use of electron beam evaporation, the process pressure being $10^{-6}$ mbar. The Pt injection layer is then patterned photolithographically in a manner known per se to suit the intended application. Through the use of organic molecular beam deposition (OMBD), at a process vacuum of $10^{-8}$ mbar, the low molecular weight compound 4,4',4"-Tris[N-(1-naphthyl)-N-phenyl-amino]-triphenylamine (TNATA) for transporting positive charge carriers, and the aluminum (III) salt of 8-hydroxyquinoline as the emission and electron transport material are then deposited successively, the layer thicknesses of the materials being 60 nm each, and the growth rates being 2 nm/min.

On top of the device thus obtained a cathode is applied through the use of a shadow mask. The cathode is formed of a magnesium layer having a thickness of 120 nm and a silver layer having a thickness of 120 nm, which are successively deposited by thermal evaporation (from tungsten boats) at a process pressure of $10^{-6}$ mbar. The contact areas of the LEDs thus defined are round and have a diameter of 1.5 mm; the spacing between adjacent components is 4.5 mm. The emission color is greenish yellow and distinctly visible, even in bright daylight with sunshine.

EXAMPLE 2

On top of a device fabricated in accordance with Example 1 a cathode is applied which is formed of a layer of a magnesium silver alloy having a thickness of 100 nm. This layer is deposited by simultaneous thermal evaporation of magnesium and silver (from two tungsten boats) in an atomic mass ratio of 10:1 at a process pressure of $10^{-6}$ mbar. A silver layer having a thickness of 100 nm serves to stabilize the contact. The contact areas of the LEDs thus defined are round and have a diameter of 1.5 mm; the spacing between adjacent components is 4.5 mm. The emission color is greenish yellow and distinctly visible, even in bright daylight with sunshine.

EXAMPLE 3

Light emitting diodes are fabricated in accordance with Example 1, the Pt injection layer being applied through the use of a thermal evaporation process instead of by electron beam evaporation. The contact areas of the LEDs are round and have a diameter of 1.5 mm; the spacing between adjacent components is 4.5 mm. The emission color is greenish yellow and distinctly visible, even in bright daylight with sunshine.

EXAMPLE 4

Light emitting diodes are fabricated in accordance with Example 2, the Pt injection layer being applied through the use of a thermal evaporation process instead of by electron beam evaporation. The contact areas of the LEDs are round and have a diameter of 1.5 mm; the spacing between adjacent components is 4.5 mm. The emission color is greenish yellow and distinctly visible, even in bright daylight with sunshine.

EXAMPLE 5

Light emitting diodes are fabricated in accordance with example 1, the Pt injection layer being applied through the use of a sputtering process instead of by electron beam evaporation. The contact areas of the LEDs are round and have a diameter of 1.5 mm; the spacing between adjacent components is 4.5 mm. The emission color is greenish yellow and distinctly visible, even in bright daylight with sunshine.

EXAMPLE 6

Light emitting diodes are fabricated in accordance with Example 2, the Pt injection layer being applied through the use of a sputtering process instead of by electron beam evaporation. The contact areas of the LEDs are round and have a diameter of 1.5 mm; the spacing between adjacent components is 4.5 mm. The emission color is greenish yellow and distinctly visible, even in bright daylight with sunshine.

We claim:

1. A method for minimizing the operating voltage of an organic light emitting diode, which comprises:
   providing a transparent substrate;
   applying thereto a transparent bottom electrode;
   applying directly onto said bottom electrode a semitransparent layer of a metal having a work function in the range from 4 to 7 eV;
   applying directly onto said semitransparent layer at least one organic functional layer and a top electrode comprising magnesium and silver.

2. The process according to claim 1, wherein magnesium and silver are applied successively.

3. The process according to claim 1, wherein magnesium and silver are applied simultaneously.

4. The process according to claim 1, wherein the semitransparent layer is applied by electron beam vaporization.

5. The process according to claim 1, wherein the semitransparent layer is applied by sputtering.

6. The process according to claim 1, wherein the semitransparent layer is applied by thermal vaporization.

7. The process according to claim 1, in which the semitransparent layer of a metal is a hole injection layer.

8. The process according to claim 1, wherein the metal of said semitransparent layer is platinum.

9. A method for minimizing the operating voltage of an organic light emitting diode, which comprises:

providing a transparent substrate;

applying thereto a transparent bottom electrode;

applying directly onto said bottom electrode a semitransparent layer of a metal having a work function in the range of greater than 4 to 7 eV;

applying directly onto said semitransparent layer at least one organic functional layer and a top electrode consisting of magnesium and silver.

10. A method for minimizing the operating voltage of an organic light emitting diode, which comprises:

providing a transparent substrate;

applying thereto a transparent bottom electrode;

applying directly onto said bottom electrode a semitransparent layer of a metal having a work function in the range of greater than 4 to 7 eV;

applying directly onto said semitransparent layer at least one organic functional layer and a top electrode comprising magnesium and silver.

11. The method according to claim 10, wherein said metal of said semitransparent layer is selected from the group consisting of palladium, silver, iridium, platinum, and gold.

12. The method according to claim 10, wherein said metal of said semitransparent layer is selected from the group consisting of chromium, iron, cobalt, nickel, molybdenum, and tungsten.

* * * * *